(12) United States Patent
Forlenza et al.

(10) Patent No.: US 9,274,172 B2
(45) Date of Patent: Mar. 1, 2016

(54) SELECTIVE TEST PATTERN PROCESSOR

(71) Applicant: International Business Machines Corporation, Armonk, NY (US)

(72) Inventors: Donato O. Forlenza, Hopewell Junction, NY (US); Orazio P. Forlenza, Hopewell Junction, NY (US); Michael P. Grace, Waltham, VT (US); Bryan J. Robbins, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 132 days.

(21) Appl. No.: 14/055,952

(22) Filed: Oct. 17, 2013

(65) Prior Publication Data

US 2015/0113349 A1    Apr. 23, 2015

(51) Int. Cl.
*G01R 31/3177*   (2006.01)
*G01R 31/28*   (2006.01)
*G06F 11/25*   (2006.01)
*G01R 31/3183*   (2006.01)

(52) U.S. Cl.
CPC ............................... *G01R 31/318371* (2013.01)

(58) Field of Classification Search
CPC .................. G01R 31/318342; G01R 31/3177; G01R 31/318371; G06F 11/261; G06F 11/25
USPC .................. 714/738, 742, 703, 724, E11.155; 716/105
See application file for complete search history.

(56) References Cited

U.S. PATENT DOCUMENTS

| | | | | |
|---|---|---|---|---|
| 4,791,357 | A * | 12/1988 | Hyduke | ........................ 324/73.1 |
| 6,041,429 | A | 3/2000 | Koenemann | |
| 7,475,317 | B2 * | 1/2009 | Marinissen | .... G01R 31/318371 714/728 |
| 7,685,487 | B1 | 3/2010 | Kuo et al. | |
| 7,921,346 | B2 | 4/2011 | Forlenza et al. | |
| 8,127,187 | B2 * | 2/2012 | Xia | ................ G01R 31/318563 714/726 |
| 8,209,141 | B2 | 6/2012 | Bassett et al. | |
| 2006/0182187 | A1 * | 8/2006 | Likovich | ................... H04L 1/22 375/257 |
| 2008/0115029 | A1 * | 5/2008 | Kusko et al. | ................... 714/742 |
| 2009/0132976 | A1 * | 5/2009 | Desineni et al. | ................... 716/5 |
| 2009/0144595 | A1 * | 6/2009 | Reohr et al. | ................... 714/732 |

OTHER PUBLICATIONS

Anonymous "Method and System for Generating a Test Pattern Instantaneously from an Automatic Test Pattern Generation (ATPG) Simulation", IPCOM000211577D, Oct. 12, 2011, pp. 1-3.

* cited by examiner

*Primary Examiner* — Phung M Chung
(74) *Attorney, Agent, or Firm* — Cantor Colburn LLP; Margaret McNamara

(57) ABSTRACT

A method, system, and computer program product to test a semiconductor device are described. The method includes receiving a set of test patterns for testing the semiconductor device and a user selecting a subset of the set of test patterns. The method also includes cataloging a content of pattern files associated with the subset of the set of test patterns to generate a catalog, and processing the catalog to output test data to the semiconductor device.

5 Claims, 3 Drawing Sheets

SELECTIVE TEST PATTERN PROCESSOR

BACKGROUND

The present invention relates to testing of a semiconductor device, and more specifically, to automated selective testing of a semiconductor device.

When a semiconductor design such as for a wafer, module, application specific integrated circuit (ASIC), or very large scale integrated circuit (VLSI) is tested, the testing involves a set of commercially available test patterns specific to the product under test. The commercially available test pattern generator output is made platform specific by an on-site test pattern processor that may support several test system platforms, for example. While the test pattern generator provides an efficient source for comprehensive testing of the product, the processing of all the test patterns can become time-consuming. At various stages of development, quick feedback from testing is important to determine, for example, new patterns that must be tested to isolate any issues. Thus the time associated with the test pattern processor processing all the test patterns may present issues.

SUMMARY

According to one embodiment of the present invention, a method of testing a semiconductor device includes receiving, at a pattern processor from a test pattern generator, a set of test patterns for testing the semiconductor device; selecting, by a user, a subset of the set of test patterns; cataloging, by the pattern processor, a content of pattern files associated with the subset of the set of test patterns to generate a catalog; and processing, by the pattern processor, the catalog to output test data to the semiconductor device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, the processing of all the test patterns provided by a commercially available test pattern generator can be time consuming and inefficient. Test patterns may be used in many sectors of a product's final test including, for example, power-on, engineering product bring-up, design verification, test coverage, yield analysis, characterization, diagnosis, burn-in, and manufacturing final test. During each of the stages, turn around time (TAT) of the testing plays a major role in determining feasibility, capability, manufacturability, and functionality of a design. In fact, the time and data volume associated with the processing can be one of the most critical items affecting the usefulness of testing designs and test patterns. Embodiments of the system and method described herein facilitate processing of a subset of the test patterns. Embodiments of the invention also facilitate selection of American Standard Code for Information Interchange (ASCII) rather than binary test pattern files.

Figure 1:
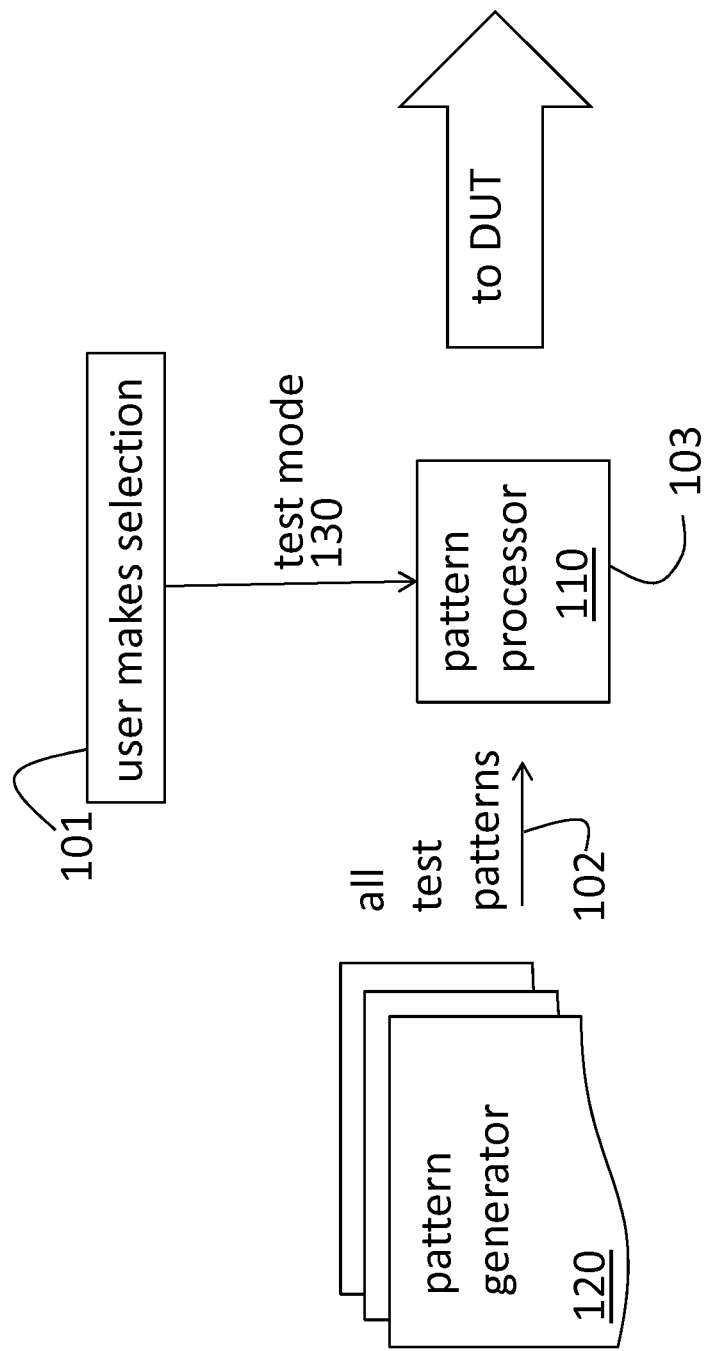
FIG. 1 is a process flow of a method of generating tests for a device under test according to embodiments of the invention.

FIG. 1 is a process flow of a method of generating tests for a device under test according to embodiments of the invention. At block 101, a user testing the device under test (DUT) may submit a selection of an initial test mode 130. A test mode 130 defines a subset of test patterns for processing by a pattern processor 110. There may be information embedded in the selected initial test mode 130 that specifies an expanded subset of test patterns. In alternate embodiments, the user specifies a test mode 130 defining a subset of test patterns in ASCII or binary pattern files. The user may also elect to process only newly released test patterns. At 102, the test pattern generator 120 provides all the test patterns to the pattern processor 110. At 103, the pattern processor 110 processes only the subset of test patterns that are specified by the user (e.g., based on selected test mode 130). Processing by the pattern processor 110 at 103 includes the pattern processor 110 cataloging only the subset of test patterns that are based on the user selection of test mode. This decreased cataloging (as compared to cataloging the full set of test patterns) holds true for embodiments that include user selection of a test mode 130 or test patterns in ASCII as well as binary format. Cataloging includes listing the contents of the pattern files that are part of the selection. In the case of an ASCII format selection by the user, the pattern processor 110 may directly process ASCII test patterns provided by the test pattern generator 120.

Figure 2:
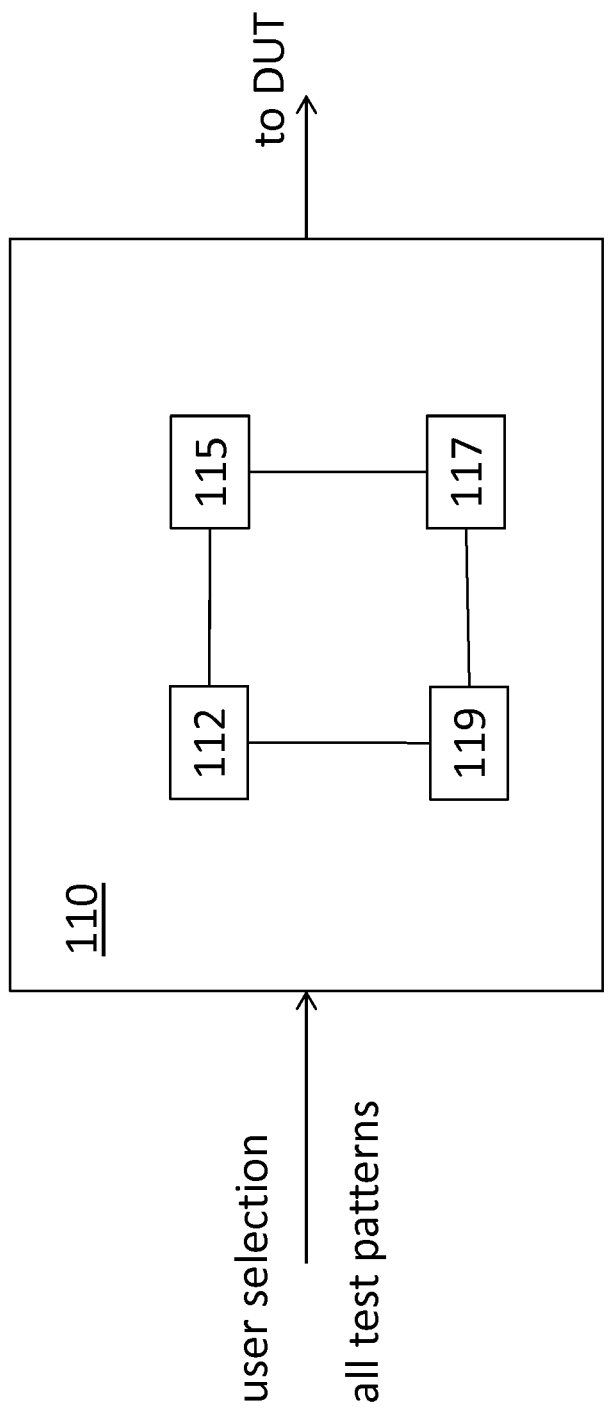
FIG. 2 is a block diagram of a pattern processor according to an embodiment of the invention.

FIG. 2 is a block diagram of a pattern processor 110 according to an embodiment of the invention. The pattern processor 110 includes one or more processors 112, one or more memory devices 115, an input interface 117, and an output interface 119. The pattern processor 110 receives input from the test pattern generator 120 (complete set of all test patterns) and the user (e.g., test mode 130 selection) through the input interface 117. The one or more processors 112 use instructions stored in the one or more memory devices 115 to catalog only the selected test pattern files and process the test patterns of the selected test patterns to generate the output for the DUT. This output is specific to the platform of the DUT. The memory device 115 stores instructions that facilitate the association between a user selected test mode 130 and a subset of the test patterns from the test pattern generator 120. For example, the correspondence between a user-identified test mode 130 and a subset of test patterns may be stored in the memory device 115 in the form of a look up table or in another format. Test modes 130 may be added or modified as needed in the pattern processor 110. A number of test modes 130 may be selected in turn to complete a full test at a particular stage for the DUT. The catalog generated by the processor 112 may be stored in the memory device 115, as well.

Figure 3:
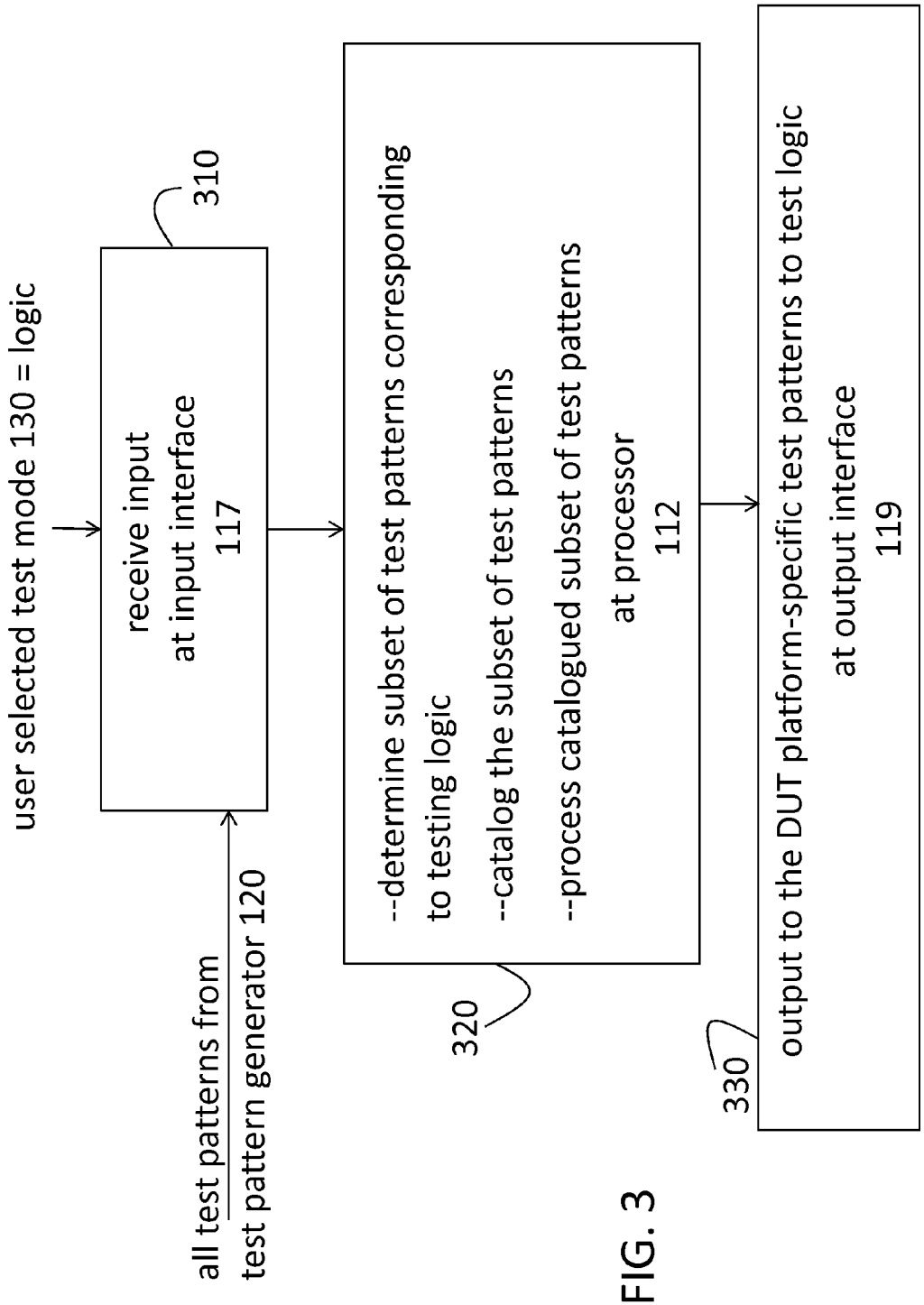
FIG. 3 is a process flow of an exemplary test mode by the pattern processor according to an embodiment of the invention.

FIG. 3 is a process flow of an exemplary test mode 130 by the pattern processor 110 according to an embodiment of the invention. At block 310, the input interface 117 of the pattern processor 110 receives the full set of patterns from the pattern generator 120. The input interface 117 also receives the user selected test mode 130 as the logic test mode. As noted above, the user selection of the test mode 130 may be in binary or ASCII format. Other exemplary test modes 130 include the array test mode or the selection of one or more chips, for example. Each test mode 130 may have some number of test patterns associated with it (e.g., 10 patterns). The test mode 130 puts the DUT in a particular state to test the portion of the DUT identified by the test mode 130. That is, for example, the logic test mode puts the DUT in a state in which the logic of the DUT may be tested by the test platform. At block 320, the processor 112 of the pattern processor 110, in conjunction with the memory device 115, determines the subset of test patterns (among the full set of tests patterns received from the test pattern generator 120) corresponding with the logic test mode selected by the user. The processor 112 then catalogues and processes only the subset of test patterns. At block 330, the output interface 119 of the pattern processor 110 outputs, to the DUT, platform-specific test patterns that test the logic (the selected test mode 130).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just examples. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of testing a semiconductor device, the method comprising:
    receiving, at a pattern processor from a test pattern generator, a set of test patterns for testing the semiconductor device;
    selecting, by a user, a subset of the set of test patterns;
    cataloging, by the pattern processor, a content of pattern files associated with the subset of the set of test patterns by listing the content of pattern files associated with the subset of the set of test patterns to generate a catalog; and
    processing, by the pattern processor, the catalog to output test data to the semiconductor device.

2. The method according to claim 1, wherein the selecting the subset is based on the user selecting a test mode specifying the subset of the set of test patterns.

3. The method according to claim 1, wherein the selecting the subset is of the subset of the set of test patterns in American Standard Code for Information Interchange (ASCII) format and the cataloging is of the pattern files in the ASCII format.

4. The method according to claim 1, wherein the selecting the subset is of the subset of the set of test patterns in binary format and the cataloging is of the pattern files in the binary format.

5. The method according to claim 1, wherein the processing the catalog by the pattern processor results in the test data being specific to a platform being used to test the semiconductor device.

* * * * *